(12) United States Patent
Little et al.

(10) Patent No.: US 7,468,237 B2
(45) Date of Patent: Dec. 23, 2008

(54) INTEGRATED OPTICAL CIRCUITS HAVING DROP-IN LOCATIONS FOR OPTICAL CIRCUIT ELEMENTS

(75) Inventors: Brent E. Little, Glen Head, NY (US);
John V. Hryniewicz, Columbia, MD (US); David M. Gill, Pasadena, CA (US); Roy Davidson, Glen Burnie, MD (US); Philippe P. Absil, Branie-L'alleud (BE)

(73) Assignee: Infinera Corporation, Sunnyvale, CA (US)

(*) Notice: Subject to any disclaimer, the term of this patent is extended or adjusted under 35 U.S.C. 154(b) by 0 days.

(21) Appl. No.: 11/850,622

(22) Filed: Sep. 5, 2007

(65) Prior Publication Data

US 2007/0297715 A1    Dec. 27, 2007

Related U.S. Application Data

(63) Continuation of application No. 10/921,645, filed on Aug. 19, 2004, now Pat. No. 7,282,311.

(51) Int. Cl.
*G03C 5/00* (2006.01)
*G02B 6/10* (2006.01)
*G02B 6/12* (2006.01)

(52) U.S. Cl. ............... 430/270.1; 385/14; 385/129; 385/130; 385/131; 385/132; 430/321

(58) Field of Classification Search .......... 430/321, 430/270.1, 312; 385/14, 129–132
See application file for complete search history.

(56) References Cited

U.S. PATENT DOCUMENTS

| | | | |
|---|---|---|---|
| 5,972,567 A | 10/1999 | Hu | |
| 6,030,752 A | 2/2000 | Fulford, Jr. et al. | |
| 6,337,162 B1 | 1/2002 | Irie | |
| 6,517,997 B1 | 2/2003 | Roberts | |
| 6,594,817 B2 * | 7/2003 | Federico et al. | 716/19 |
| 6,614,977 B2 | 9/2003 | Johnson et al. | |
| 6,771,868 B2 | 8/2004 | Johnson et al. | |
| 6,893,806 B2 * | 5/2005 | Bollinger et al. | 430/394 |
| 7,174,081 B2 * | 2/2007 | Hayamizu et al. | 385/131 |

OTHER PUBLICATIONS

Brent E. Little et al., A VLSI Photonics Plateform for Microwave Photonics Application, Optical Fiber Communications Conference, OFC 2003, vol. 2, pp. 444-445, Mar. 23-28, 2003.
Brent E. Little et al., Ultra-Compact Si-SiO2 Micro-Ring Resonator Optical Channel Dropping Filters. Photonics Technology Letters, vol. 10(4), pp. 549-551, Apr. 1998.

* cited by examiner

*Primary Examiner*—Christopher G Young
(74) *Attorney, Agent, or Firm*—W. Douglas Carothers, Jr.; Ross M. Carothers

(57) ABSTRACT

A plurality of mask images defines an optical circuit image in photoresist. Each of the mask images comprises parts of the optical circuit and the totality of all mask images together defines an optical circuit. The optical circuit is thus made up of plural optical elements some of which may be positioned in drop-in locations within the boundary of another optical circuit element. A photolithography system globally aligns and exposes the mask images in photoresist. The resultant composite image is substantially indistinguishable from a single image of the entire optical circuit. Different images for each of the mask image parts can be substituted with other images or image parts and thereby exponentially increasing the number of circuit permutations from a predetermined number of available mask images. A unique optical circuit, for example, can be generated from a pre-existing library of reticle images. The images are printed in predetermined locations on a substrate to define the desired optical circuit. Thus, predefined second optical circuit elements can be dropped in (imaged or exposed) locations within a first optical circuit.

10 Claims, 12 Drawing Sheets

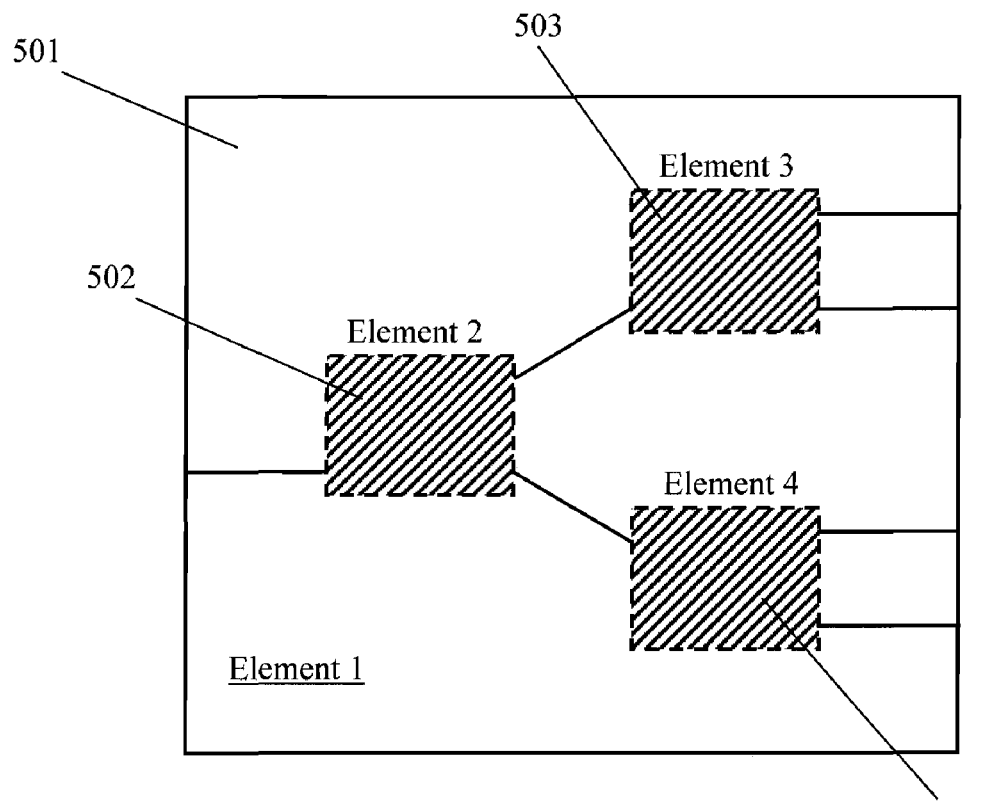
*Fig. 5A*
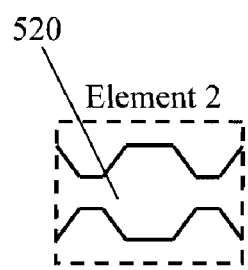 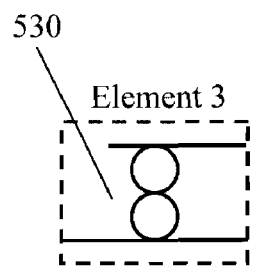 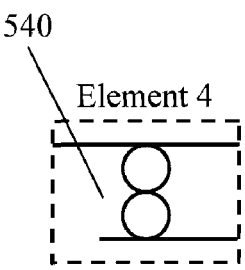
*Fig. 5B*　　*Fig. 5C*　　*Fig. 5D*

INTEGRATED OPTICAL CIRCUITS HAVING DROP-IN LOCATIONS FOR OPTICAL CIRCUIT ELEMENTS

This application is a continuation of nonprovisional patent application, Ser. No. 10/921,645, filed Aug. 19, 2004 and entitled, METHOD OF FORMING AN INTEGRATED OPTICAL CIRCUIT, which application is incorporated herein by its entirety.

BACKGROUND OF THE INVENTION

1. Field of the Invention

The present invention relates to the field of integrated optics, and more specifically to a method of producing an integrated optical circuit using lithographic techniques.

2. Description of Related Art

Integrated optical devices 100 are optical devices that are realized on a substrate. FIG. 1 is a cross section through the substrate of an integrated optical circuit. Referring to FIG. 1, the substrate 101 includes a carrier 101A and a materials stack 102 comprising thin films of dielectric, semiconductor, or polymer materials grown or deposited on one side of the carrier, here called the top side 103. Common substrate carriers include silicon, quartz, and gallium arsenide. Common dielectrics include silica, germanium doped silica, silicon, silicon nitride, silicon oxynitride, silicon oxycarbide, and LiNbO. Common semiconductors include doped silicon, GaAsInP, and other III-V compounds. Channels are formed in the dielectrics and these channels guide light and perform some sort of optical signal processing function.

In an often used approach for the fabrication of optical devices, a photolithographic mask (also called a photomask or simply a mask), containing an image of the optical circuit design, is employed to print the circuit. FIG. 2 shows a cross sectional view of a photoresist covered substrate being exposed to a source of radiation through a mask. Referring to FIG. 2, the circuit is printed by exposing a photoresist 205 covered substrate 201 to a source of irradiance 202 through a mask 203. The mask 203 contains a pattern of the circuit to be printed. The mask receives its name from the fact that the circuit pattern on the mask selectively blocks (masks) at 203A or transmits (unmasks) at 203B the source of irradiance 202. The remaining or transmissive irradiance 204 that reaches the photoresist after passing through the mask defines the optical circuit pattern. The photoresist 205 on the substrate is subsequently chemically developed leaving a patterned copy of the optical circuit image in photoresist on the surface of the substrate. The photoresist pattern can be either positive or negative. A positive image means that photoresist remains after development where irradiance is masked, while a negative image means photoresist remains where irradiance is unmasked. The photoresist polarity (positive or negative) depends on the mask pattern and the type of photoresist used. The photoresist pattern is transferred into the substrate by etching techniques. A general description of techniques for the fabrication of optical integrated circuits can be found in Hiroshi Nishihara et. al. "Optical Integrated Circuits", McGraw-Hill, N.Y., 1987, and is incorporated herein by reference.

The technique of and the process for exposing a mask image onto a photoresist covered substrate is called, "photolithography". The three major types of photolithography are contact printing, proximity printing, and projection printing. In contact printing, the mask is placed directly on a photoresist covered substrate. In proximity printing the mask and photoresist covered substrate are separated by a small distance and there is no optical imaging between the two. In projection printing, lens elements or mirrors are used to focus the mask image onto the photoresist covered substrate, which is spaced from the mask by a comparatively large distance. The mask used in projection lithography is commonly called a reticle. (We will use here the terms reticle and mask interchangeably). Projection printing is commonly used in semiconductor fabrication where substrates are called wafers, and many technologies have been developed, including scanners and step and repeat systems, or "steppers". Steppers project an image only onto a portion of the substrate. The maximum area printed by a stepper in one exposure is called the stepper field. Multiple images of the reticle, or different reticles, are stepped and repeated over the entire substrate area. Reticle images are typically one to ten times (1× to 10×) the size of the image projected onto the substrate, with image reduction provided by the lens system. The enlarged master image on the reticle results in finer resolution on the actual substrate image. Compared with contact or proximity systems, steppers and scanners are equipped to more precisely align a mask image to a specific position on a substrate.

Conventionally, the entire optical circuit image resides on a single mask. Therefore, in a single exposure of the mask, the entire circuit is printed on a portion of the wafer. If the actual circuit to be realized is larger than that which the reticle size can accommodate, then the circuit image must be distributed across several individual reticles. The individual reticle images are then printed sequentially in a mosaic-like approach. Some means for the alignment of the images must be provided since misalignment will compromise performance. Printing reticles in this manner is called "stitching", or "field stitching". An example of an optical circuit that stitches together numerous images is disclosed in U.S. Pat. No. 6,517,997 to S. W. Roberts. Technically this is "inter-field stitching" since numerous fields are stitched together in order to realize a circuit that can not be accommodated within a single field. The term "stitching boundary" is used to describe the border separating two exposed images in the photoresist. In U.S. Pat. No. 6,517,997 there are no waveguide channels traversing across any stitching boundary. An example of stitching for electronic integrated circuits is disclosed in U.S. Pat. No. 6,030,752 to H. J. Fulford.

Field stitching using stepper lithography is typically required for conventional planar lightwave circuits that use low core-to-cladding refractive index contrasts (contrasts below 1%), because such devices are invariably larger than the size of a single stepper reticle. The size of an integrated optical circuit is proportionately related to the core-to-cladding refractive index contrast (which we will refer to here simply as "index contrast"). In the last decade, the use of high index contrast materials has enabled the reduction of the size of devices to the point where they can fit entirely within the field of a reticle. For example, articles by Brent E. Little in Optical Fiber Conference ("A VLSI Photonics Platform", *Proceeding of the Optical Fiber Conference,* Vol. 2, pp. 444-445, 2003), and in Brent E. Little et al. in *Photonics Technology Letters,* ("Ultra-Compact Si—SiO$_2$ Micro-Ring Resonator Optical Channel Dropping Filters", *Photonics Technology Letters,* Vol. 10, pp. 549-551, 1998), both incorporated herein by reference, describe high index contrast material systems and devices for realizing micro-circuits. U.S. Pat. No. 6,614,977 and U.S. Pat. No. 6,771,868 both to F. Johnson et al. discloses an ideal low loss, high index contrast material system, and is incorporated herein by reference.

Each unique optical circuit design requires a unique mask image. Optical circuit design, mask design, and substrate processing (micro-fabrication) are all interrelated. In optimizing an optical circuit for production, many iterations of the design and micro-fabrication cycle need to be carried out. This incurs a significant cost and time commitment because commercial grade masks are time consuming to produce and expensive. Indeed, the performance of the final optical circuit is usually dictated by the budget used to procure masks, and the time allowed to accomplish a certain number of iterations.

An integrated optical circuit is comprised of a number optical sub-elements and waveguides. The sub-elements and waveguides are defined geometrically and have a number of parameters that affect their performance. During the development phase of an optical circuit, the optical sub-elements must be optimized both individually and as an aggregate within the circuit, in order to optimize the performance of the entire optical circuit. For example, consider an optical circuit that contains three critical sub-elements. We wish to investigate five different designs for each critical element, and we wish to do this in a complete circuit configuration. This would lead to 5×5×5 or 125 unique circuit permutations requiring 125 mask images. Each unique optical circuit, characterized by a unique combination of sub-elements and waveguides, requires its own unique mask image. Even if one parameter on one sub-element is modified, the entire optical circuit requires a new mask image. Reticles are expensive and time consuming to produce. The optimization of an optical circuit therefore can be costly and time consuming since many reticles need to be procured. Methods to reduce the number of reticles without sacrificing on the number of variables have hitherto not been disclosed.

Further, it often occurs that different products require optical circuits that although unique, are nonetheless very similar in the majority of their circuitry and architecture. For instance, a circuit may comprise twenty five optical sub-elements, twenty three of which are identical for each custom circuit. Each of these circuits requires its own reticle or series of reticles. It would be preferable if minor customization could be achieved by only changing portions of a circuit and re-using the common portion, rather than procuring an entirely custom reticle set for each product. No method has hitherto been disclosed which realizes unique circuits without using unique mask sets and no disclosure has proposed one or more drop-in circuits formed from second circuit masks for producing multiple circuit pattern configurations to form a basic optical circuit from a first circuit mask.

SUMMARY OF THE INVENTION

An optical circuit is divided into optical circuit elements. Each element is designed as an independent image residing on a mask or reticle. Element images of the circuit elements are printed sequentially on a wafer by exposing each image onto only its corresponding portion of the circuit or circuits on a photoresist covered substrate. Means are provided to align exposed images so that they define a contiguous resultant circuit image. Elements can take any shape and orientation with respect to each other, and images can be printed or otherwise formed within the boundaries of other images.

Any particular element can have numerous variations, all of which are interchangeable within the overall circuit thereby generating variations and customizations of the overall circuit by only changing one or a few elements. Elements can be reused across different products or circuit configurations. A first circuit element can include one or more drop-in locations of second optical circuit elements within the boundaries of the first optical circuit to form a resultant optical circuit.

The ability to generate circuits using the pick-and-place technique requires a means to align abutting elements to one another forming continuous and uninterrupted pathways for light to travel through the optical circuit. Alignment can be done on an element by element basis, or by global reference marks. Stepper lithography systems for example, can use global reference marks placed on the wafer to align all subsequent images.

BRIEF DESCRIPTION OF THE DRAWINGS

FIG. 5 shows the independent sub-element images of an optical circuit.

DETAILED DESCRIPTION OF THE INVENTION

Figure 1:
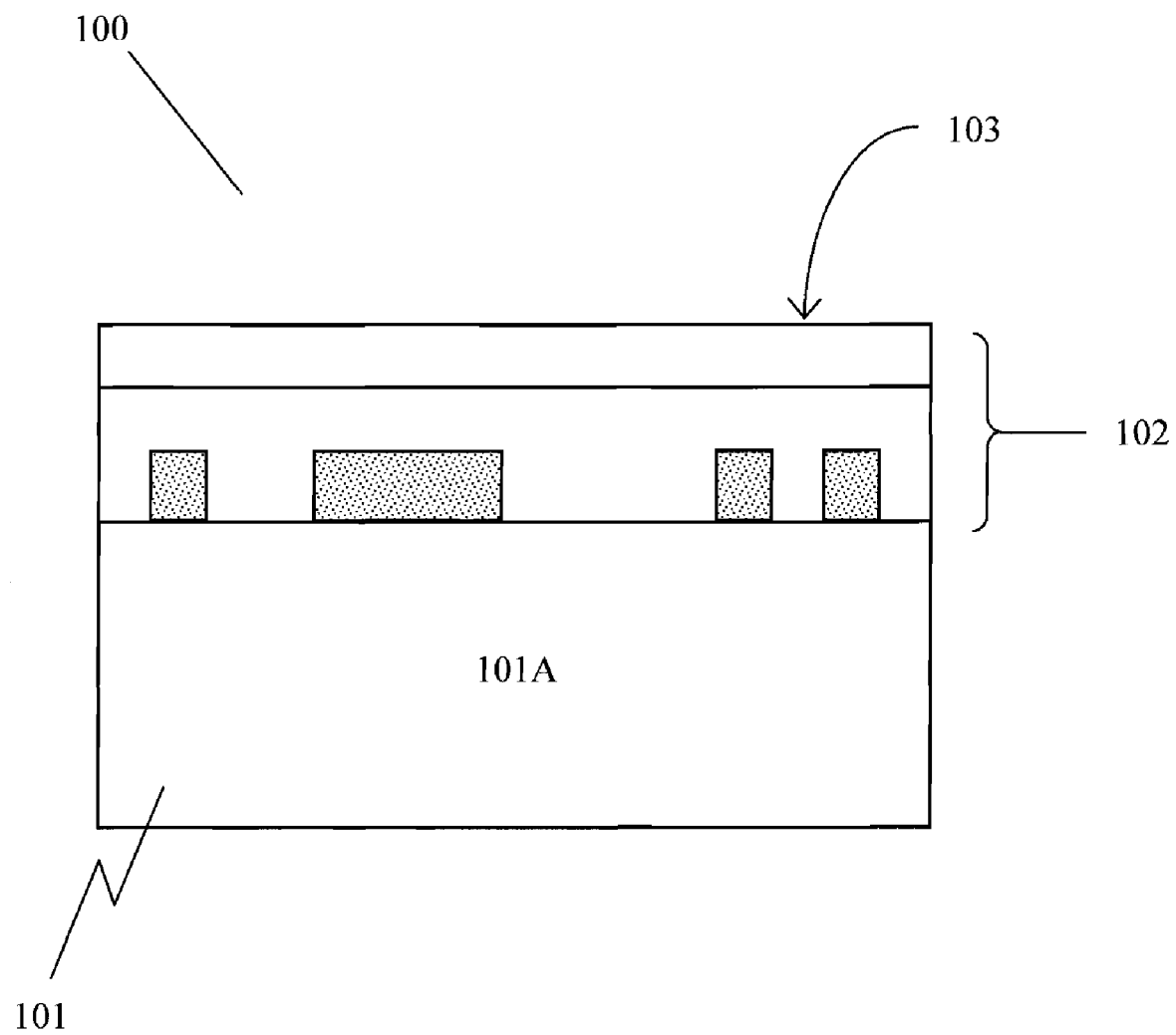
FIG. 1 shows a cross section through the substrate of an optical circuit.
Figure 2:
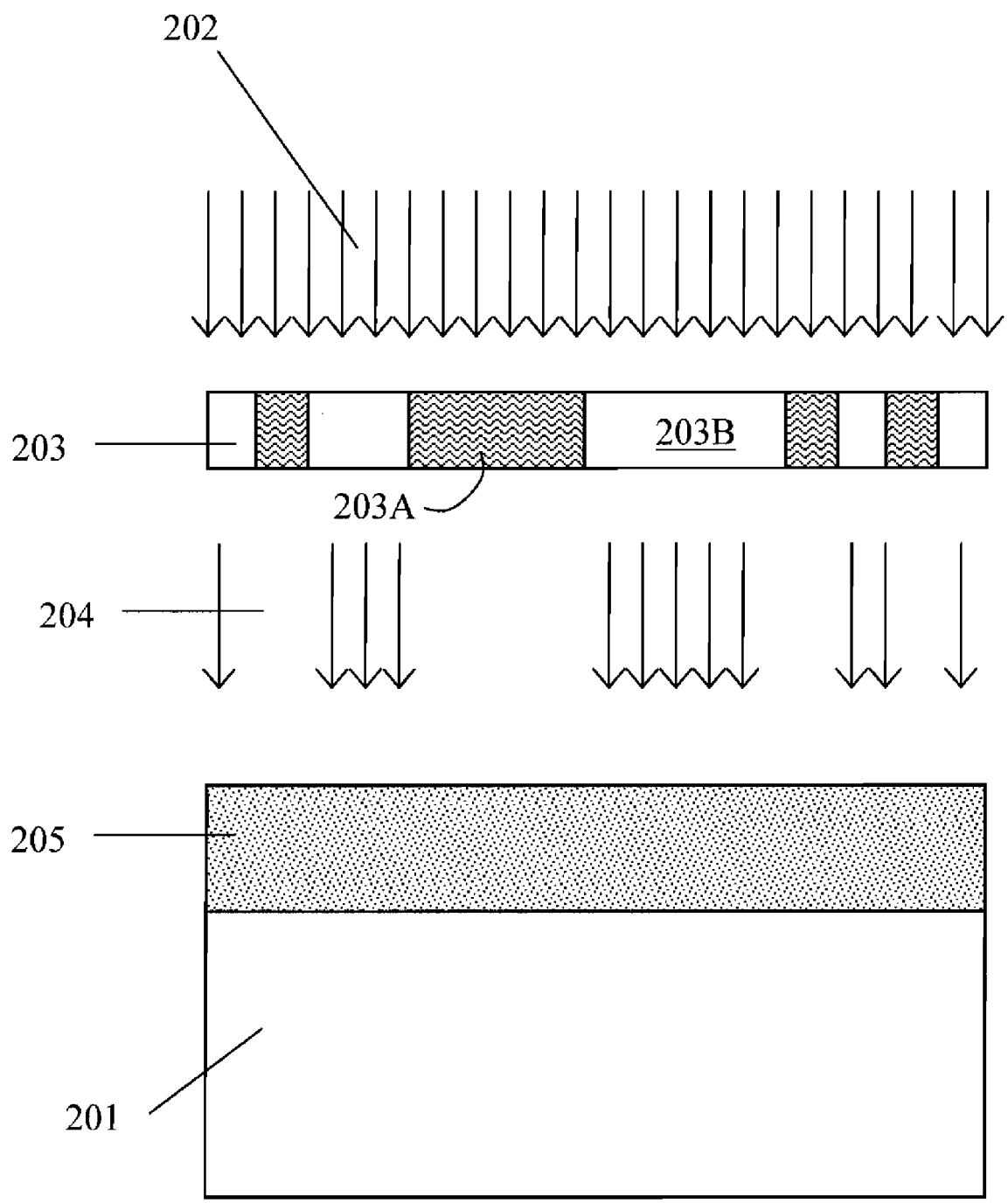
FIG. 2 shows an optical circuit being printed.
Figure 3:
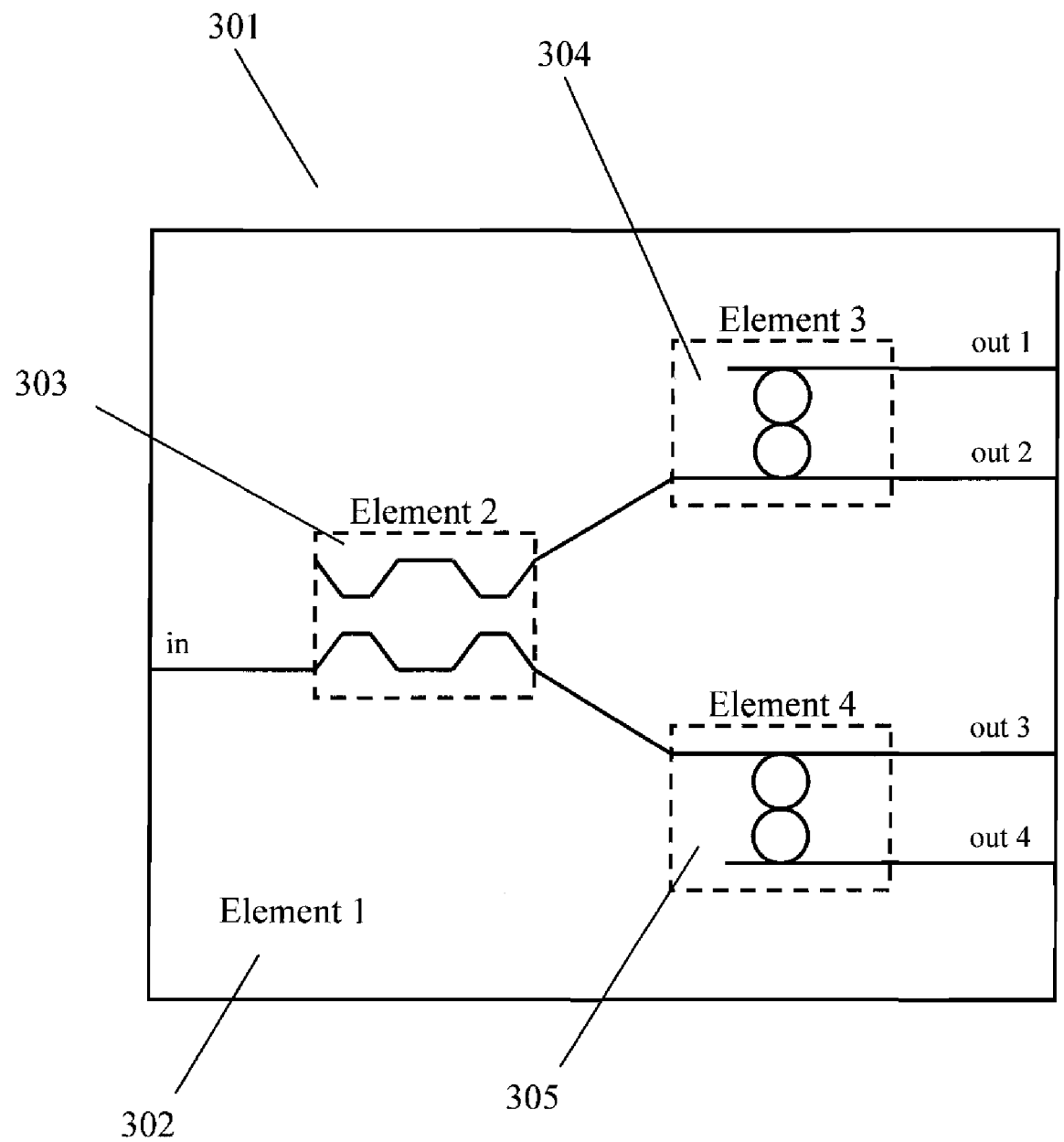
FIG. 3 shows an optical circuit that is subdivided into elements.

We describe the pick-and-place method by referring to a specific optical circuit. FIG. 3 shows an image of an optical circuit 301. The optical circuit is comprised of waveguides and other optical elements. The circuit can be conceptually and physically subdivided into elements. Referring to the circuit in FIG. 3, the circuit has been subdivided into four elements. The elements are: a circuit comprising waveguides, element 1 at 302, a switch, element 2 at 303, and two ring resonator type wavelength filters, element 3 at 304, and element 4 at 305. Dashed lines around a particular element are used to demark the boundaries of a particular element. The shape and size of these boundaries are the circuit designer's choice.

Figure 4A:
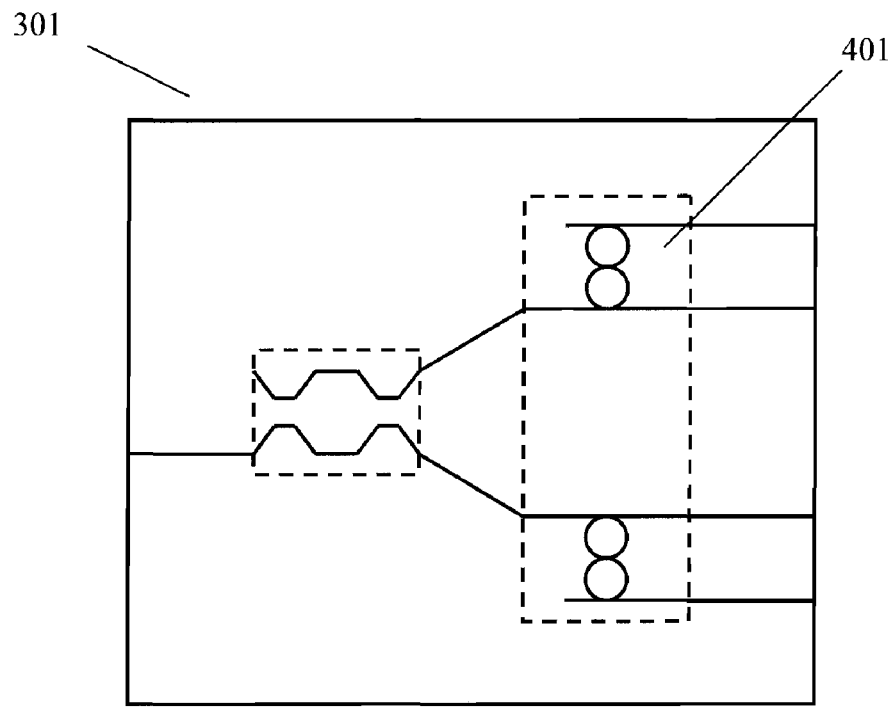
FIG. 4 shows an optical circuit that is subdivided into alternate elements.
Figure 4B:
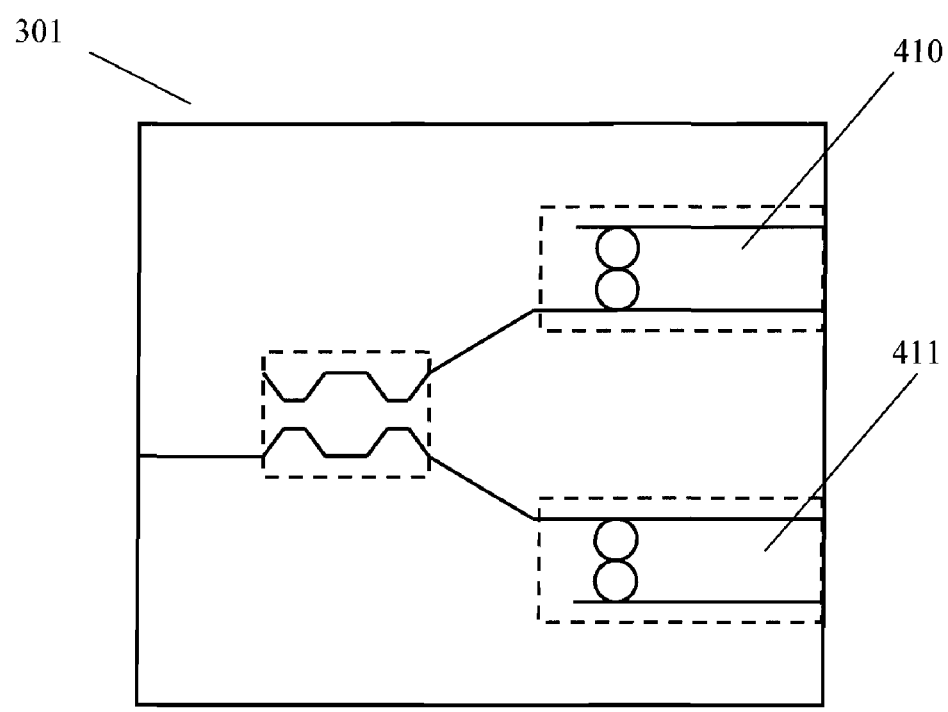

The optical circuit described in conjunction with FIG. 3 is for illustrative purposes of the pick and place method. The concepts apply to any arbitrary optical circuit with an arbitrary number of elements. The elements can be arbitrarily ascribed, and will depend on the optical circuit designer's objectives. For example, for the same circuit 301 of FIG. 3, the two ring resonator wavelength filters 304 and 305 may be lumped together as one element as shown in FIG. 4A at 401. Alternatively, the elements can be demarcated as shown in FIG. 4B where the elements now include portions of the output ports 410, 411 which were in FIG. 3 as part of element 1 at 302.

FIG. 5 shows how the optical circuit of FIG. 3 is decomposed into four independent element images. These images can all reside on a single reticle or mask, or they may be distributed on various masks. FIG. 5A shows element 1 at 501. It is comprised of the optical waveguide portion of the optical circuit. It has locations to accommodate the other elements 2, 3 and 4, shown by the hatched areas 502, 503, 504, respectively. We call these locations "drop-in-boxes" because they are the spots where other elements are effectively dropped into during the printing sequence. The "drop-in" connotation is similar to that used in electronic circuit assembly industry wherein chip ICs (integrated circuits), are dropped into a socket on a printed circuit board. The electronics assembler has the option to drop in any brand of IC that serves the same type of functionality and that fits in the same socket. The drop-in boxes of FIGS. 3 and 5A can have arbitrary shapes. However, the elements to be dropped into that location must have similar shape. FIG. 5B shows element 2 at 520, which in this case is an optical switch. FIG. 5C shows element 3 at 530, which is a ring resonator based wavelength filter. FIG. 5D shows element 4 at 540, which is also a ring resonator based wavelength filter. The two ring resonator filters 530 and 540 may have different characteristics resulting in different wavelengths being dropped, or they might have different spectral lineshapes.

Figure 6:
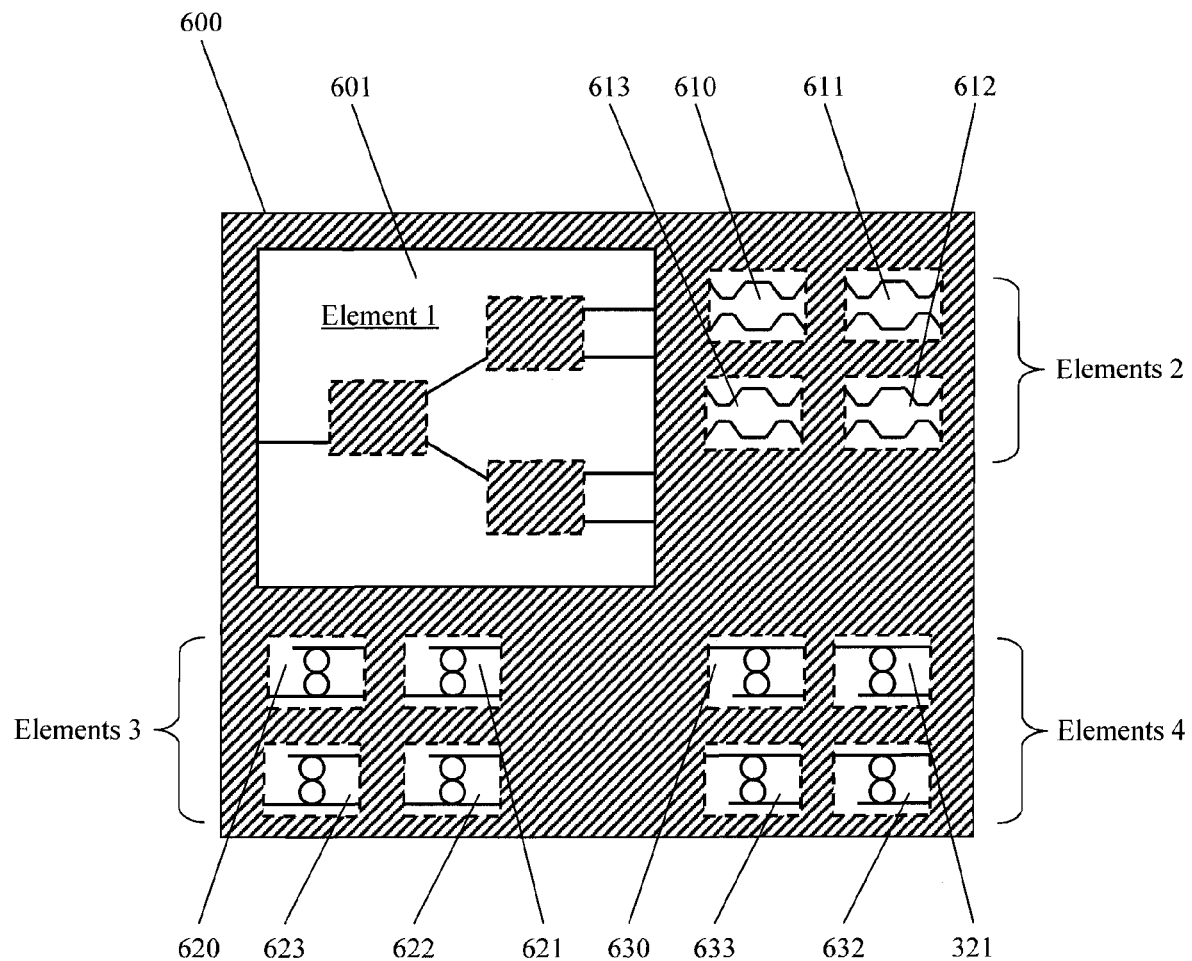
FIG. 6 shows an arrangement of sub-elements on a reticle.

FIG. 6 shows how the independent element images might be laid out on a reticle or mask. FIG. 6 shows a plan view of a mask plate 600. In this particular case, there is one image for element 1 at 601, but there are four different images for each of the other three elements 2, 3 and 4 of the circuit. For instance, images 610, 611, 612, and 613 are all optical switch elements 2 such as seen in FIG. 5B. They may each have a slightly different design, yet all can be dropped into the location for element 2 at 503 on element 1 in FIG. 5A. Likewise, images 620, 621, 622, 623 are all optical filter elements 3 such as seen in FIG. 5C. They might each have a different design to filter a different wavelength for instance, yet all can be dropped into the location for element 3 at 502 on element 1 in FIG. 5A. Images 630, 631, 632, 633 are all optical filter elements 4 such as seen in FIG. 5D. Lithography systems, such as stepper lithography, have the ability to print portions of a mask. Therefore, any image on the reticle shown in FIG. 6 can be printed independently of all other images, and can be printed anywhere on a wafer with high precision.

By picking one image from the four possible designs for each of the elements 2, 3, and 4 in FIG. 6, and dropping them into corresponding locations in element 1 of FIG. 6, there can be a total of 4×4×4=64 unique optical circuit configurations. These 64 circuit configurations are a result of 13 independent elements, all residing on a single mask. Note that typically elements of a circuit are much smaller than the circuit itself. Therefore, many independent elements can be accommodated on a single mask as demonstrated in FIG. 6. The flexibility of the pick-and-place approach is apparent, as a comparable conventional approach where a complete hard-wired circuit image is put on a mask can only accommodate one circuit variation per mask.

Figure 7A:
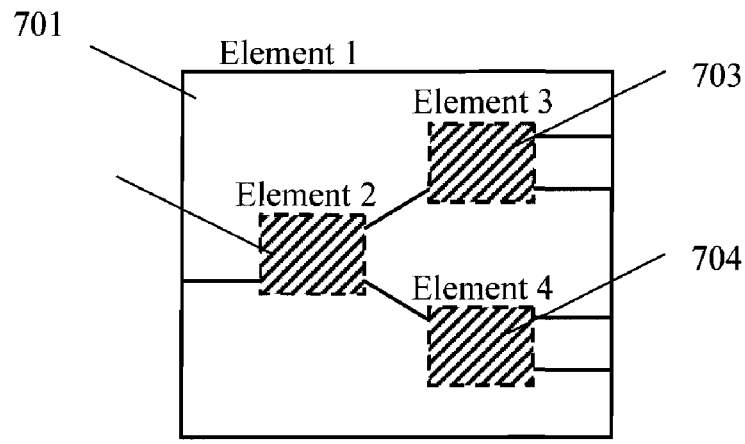
FIG. 7 shows a sequence of steps in printing an optical circuit image by pick-and-place method.
Figure 7B:
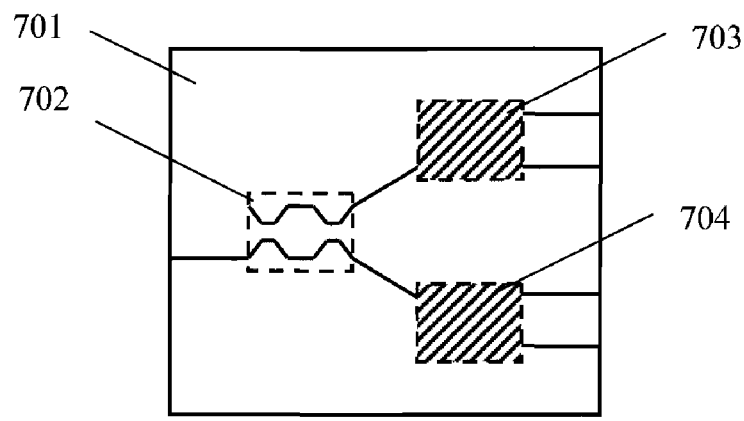
Figure 7C:
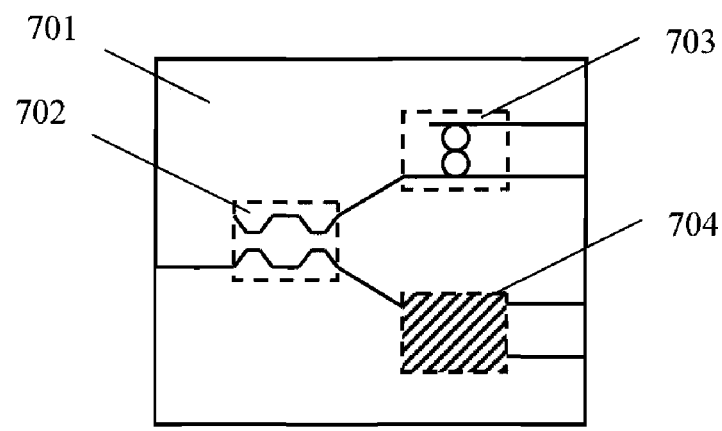
Figure 7D:
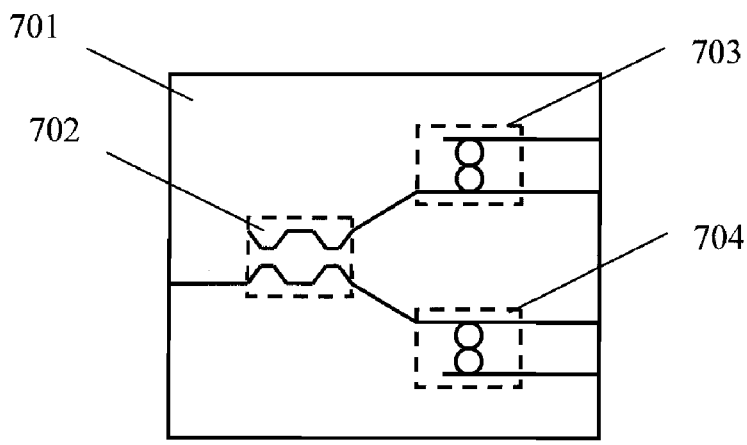

FIGS. 7A to 7D show one possible sequence of printing one variation of the optical circuit depicted in FIG. 3. FIG. 7A to 7D show the sequences of images that would be present in the photoresist after each step is completed. In FIG. 7A, element 1 from FIG. 6 (601 in FIG. 6) is first printed. The hatched areas are three unexposed photoresist areas for the three other elements to be subsequently printed. These drop-in boxes are for element 2 at 702, element 3 at 703, and element 4 at 704. In FIG. 7B, element 2 is printed in the drop-in box location 702 designated for that image. Next, in FIG. 7C, element 3 is printed in the drop-in box location 703 designated for its image. Finally, in FIG. 7D element 4 is printed in its corresponding position 704. The resultant image after step D in FIG. 7D is the complete circuit image existing in photoresist. By printing, we imply that an image on a mask is exposed onto a photoresist covered wafer. During printing of an image, it is important that areas outside an image are not exposed. Exposure of areas outside an image could result in multiple exposing of pre-existing features and washing them out. For instance, during the exposure of element 2 in FIG. 7B, the rest of the circuit area should see no irradiance because this would affect the image that was previously printed in step A of FIG. 7A, or affect printing of subsequent images in FIGS. 7C and 7D. Protection of the remainder of the circuit image can be done in photolithographic systems such as stepper lithography systems by using the shutter blades of the stepper. Using such systems typically confine the definition of a element to reside in a rectangular area. On the other hand, rectangular shaped elements have the benefit of widest compatibility and interchangeability among elements. Multiple exposures of areas of the circuit where there are no optical elements or waveguides might be acceptable, as these regions do not affect optical performance of the circuit. The sequence in FIG. 7 is arbitrary, and the elements can be printed in any order, since the printing of one element does not affect the others.

Note that in the sequence in FIGS. 7A-7D, elements 2 at 702, 3 at 703, and 4 at 704, are all printed within the boundaries of element 1 at 701. This is called intra-field stitching. Inter-field stitching, on the other hand, is used to create an image that is larger than that which could fit entirely within one mask or stepper field. The invention described here applies to both intra-field and inter-field stitching for optical circuit generation.

Figure 8:
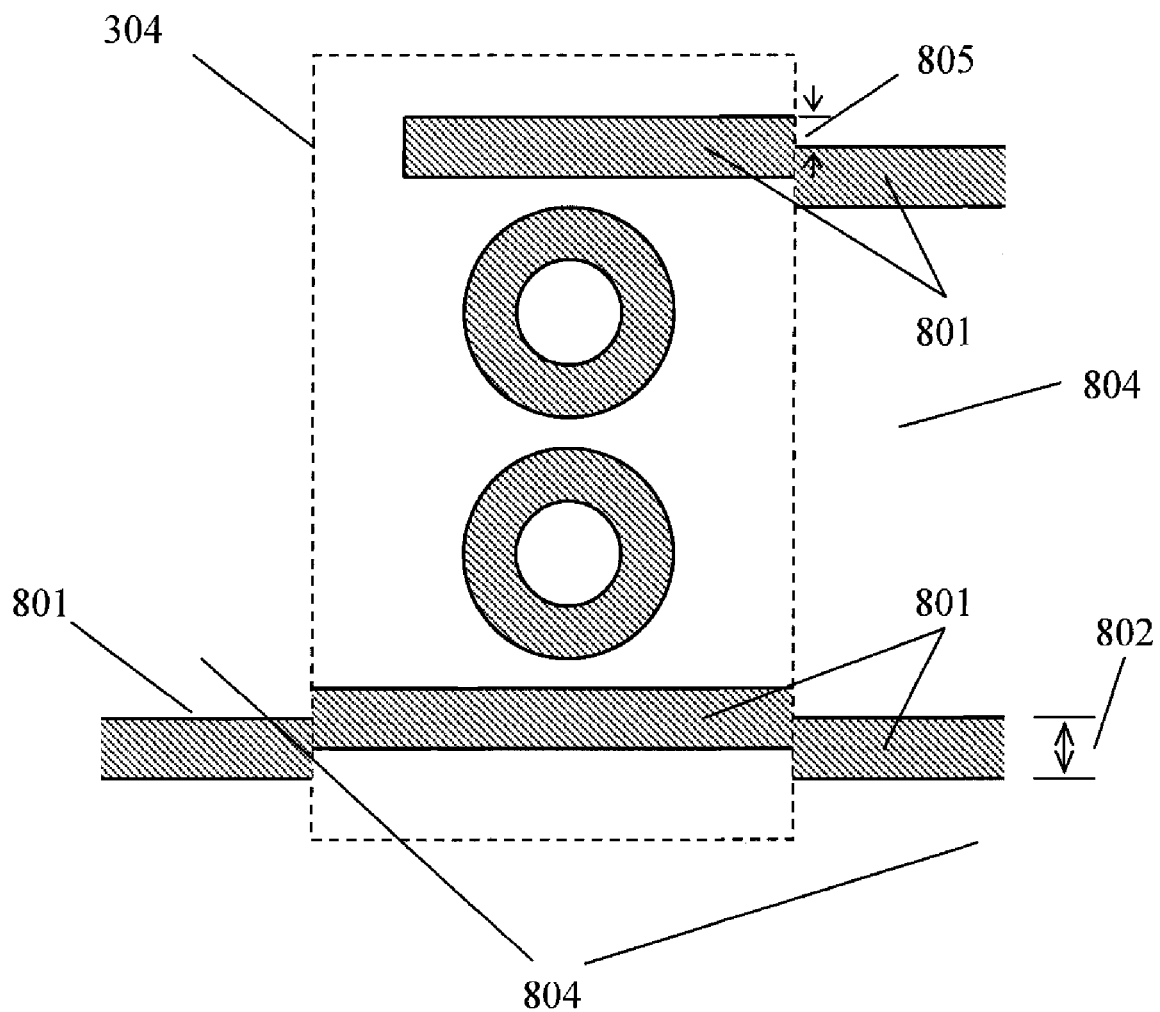
FIG. 8 shows the alignment of abutting sub-elements.

Circuit elements must be accurately aligned relative to one another, otherwise the performance of the optical circuit will be degraded. FIG. 8 shows an expanded view of the optical circuit in FIG. 3 around the location of element 3 in FIG. 3 (304 in FIG. 3). The optical waveguides 801 comprising the circuit have a certain width indicated at 802. Light is confined to the optical waveguide region. When the element 3, for example, is printed, it must register to, or be aligned to, the rest of the circuit 804. If there is an offset between the waveguides across an element-to-element boundary, such as the lateral offset shown in FIG. 8 at 805, there will be scattering of the optical signal which results in an increase in optical loss. If the offset is larger than the waveguide width 802, most of the signal will be lost in traversing the boundary between those adjacent elements. Means must, therefore, be provided to align elements with respect to each other.

Stepper lithography systems have mechanisms to align reticle images. Reference marks on the reticle are used to align to reference marks on the wafer or on the wafer handling chuck. An example of such reference marks are DFAS (Dark Field Alignment System) marks. The geometry of the marks and the mechanics used for alignment differ among stepper manufactures. In contact lithography, alignment marks are also used. However, the alignment mechanisms are more primitive and include manual positioning the mask to reference marks on the wafer or wafer holder.

Figure 9:
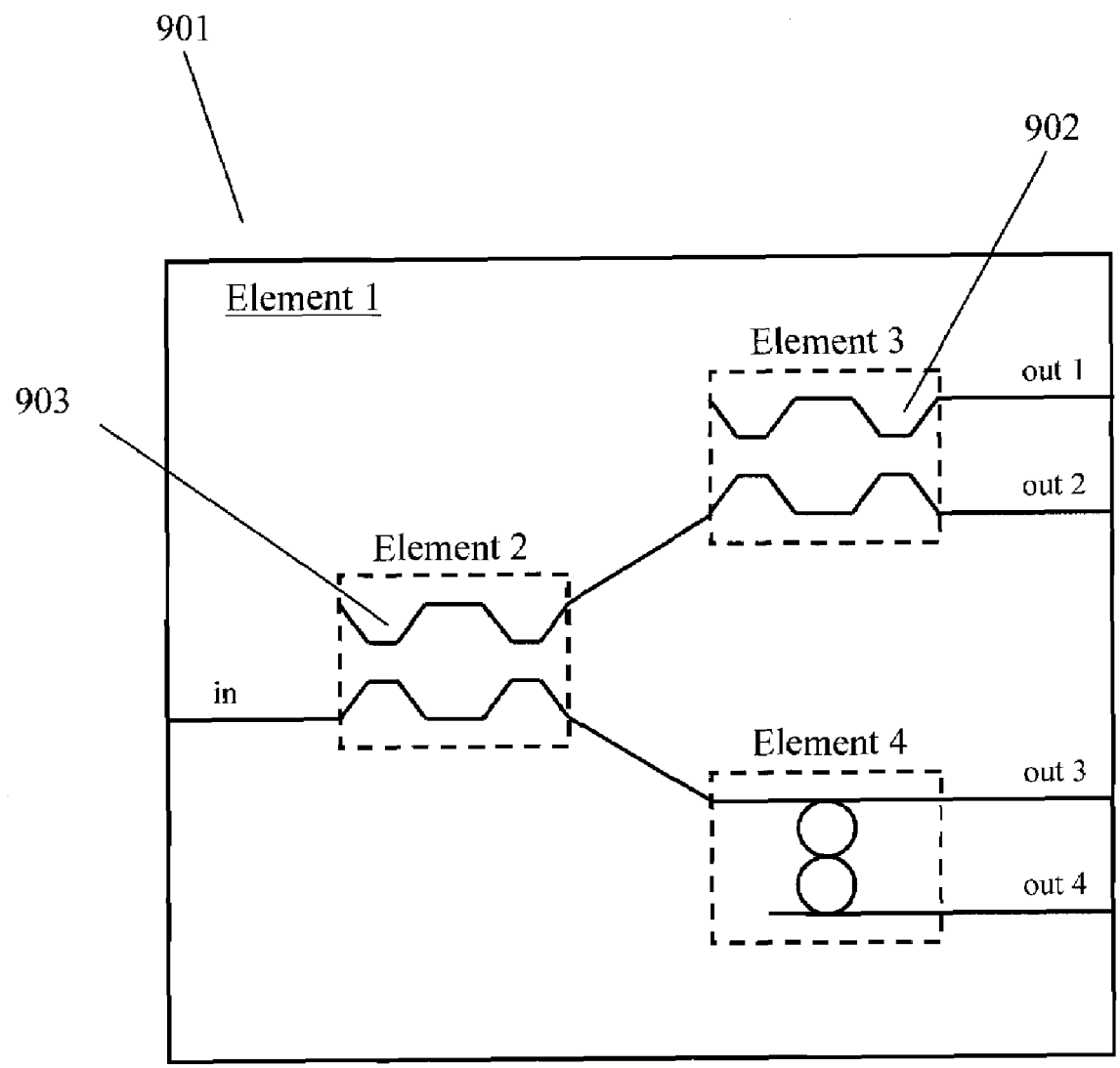
FIG. 9 shows a variation of the optical circuit in FIG. 3 having several common elements.

The pick-and-place method of circuit generation is versatile for custom circuit generation. For example, consider the optical circuit 901 shown in FIG. 9. This circuit is similar to, but not identical to circuit 301 in FIG. 3. This circuit has an optical switch in the location of element 3 at 902, as opposed to a ring resonator filter as seen in FIG. 3 (304 in FIG. 3). In order to turn the circuit of FIG. 3 into the circuit of FIG. 9, only element 3 needs to change. Further, if the design and layout is compatible, the switch image that is used for element 2 (303 in FIG. 3, 903 in FIG. 9) might also be re-used for element 3 in location 902.

Figure 10A:
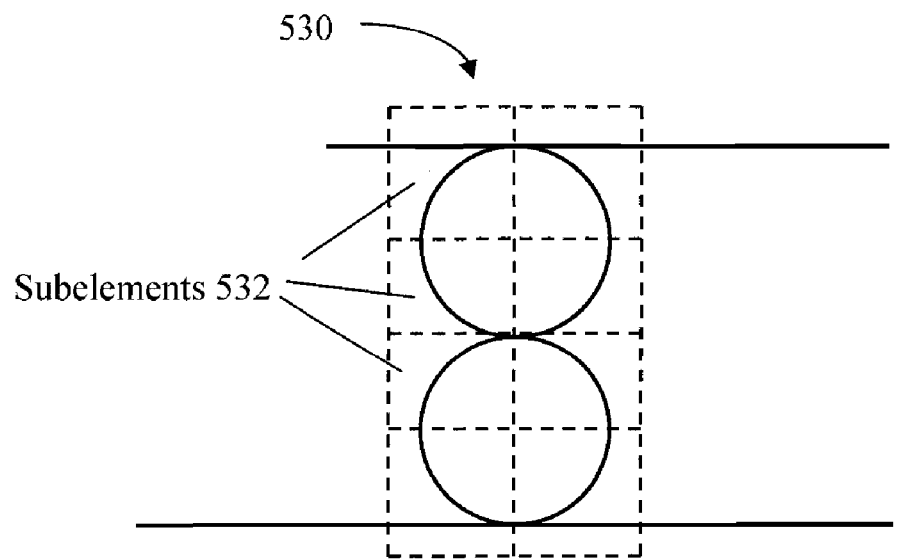
FIG. 10 shows how more primitive sub-elements might be defined and used.
Figure 10B:
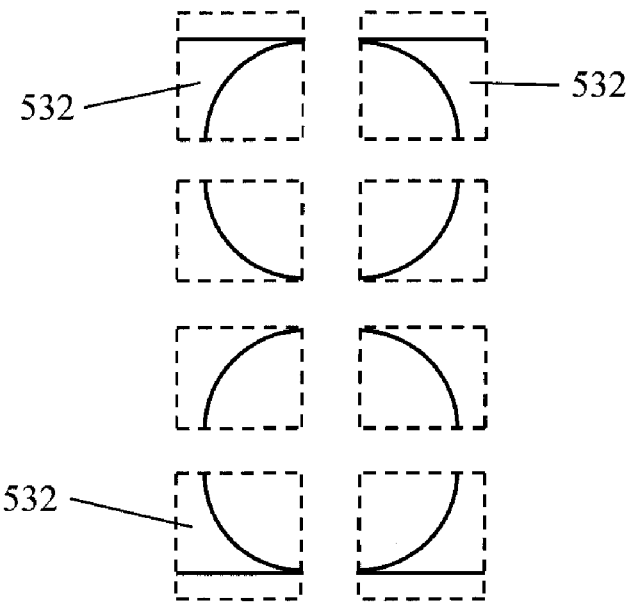

Circuit elements may be arbitrarily defined, and can be as primitive as desired. For example, elements may be comprised of straight and bent waveguides that comprise all other elements. For instance, ring resonator element 3 at 530 in FIG. 5C may be itself subdivided into subelements 532 as shown by the dashed lines in FIG. 10A. Elements 3 at 530 has been subdivided into eight subelements 532 consisting of straight and curved arc waveguide sections as shown by the dashed lines. FIG. 10B shows how the subelements 532 in FIG. 10A would appear as independent images on a mask or series of masks. Although dividing an optical circuit into smaller and smaller subelements 532 increases the total number of drop-in boxes, those types of subelements are more primitive images and can be reused in many other locations. For instance, an image of a straight waveguide can be used in all locations in the circuit that require a straight waveguide section.

Figure 11:
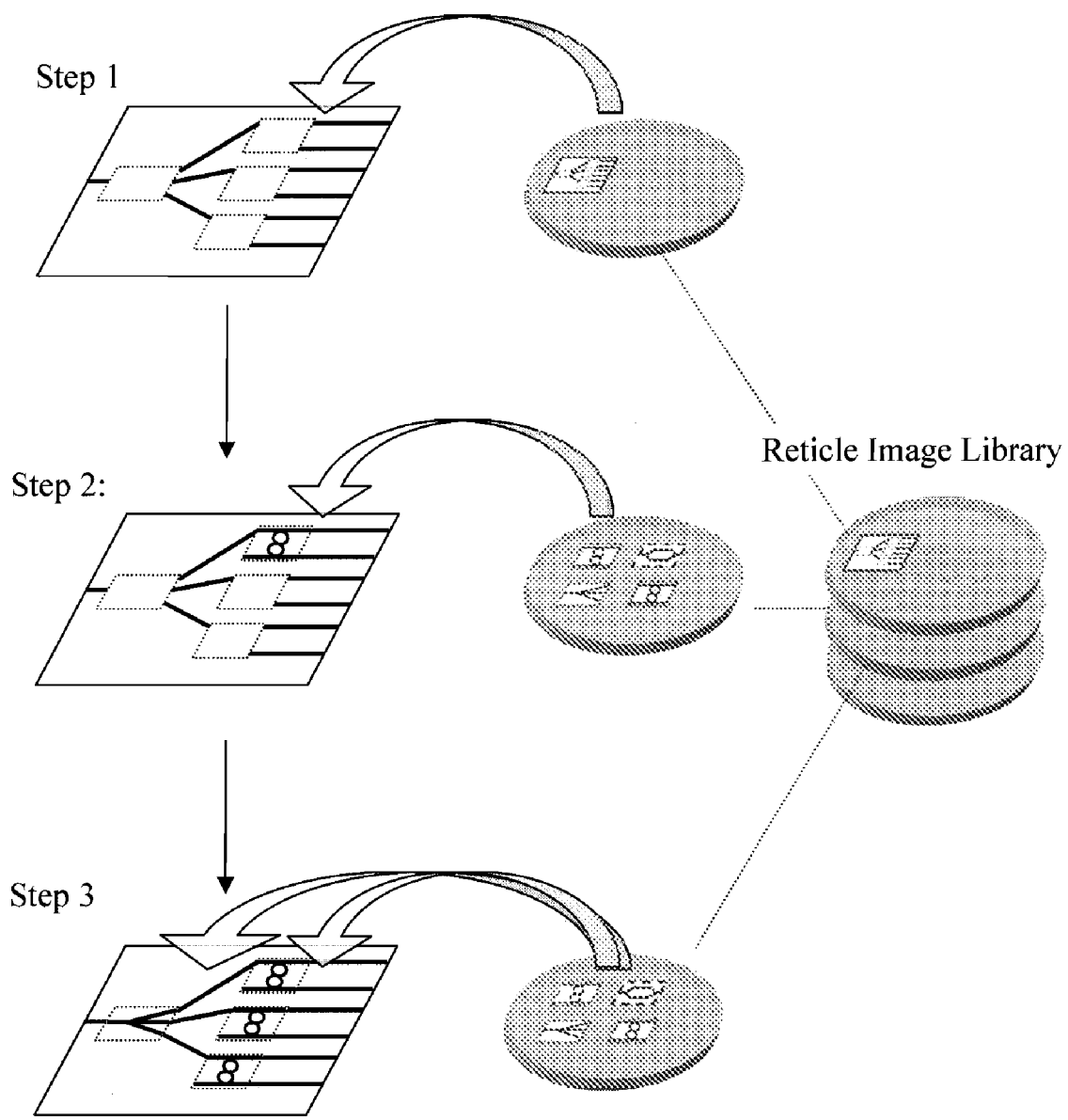
FIG. 11 shows a system for generating optical circuits from pick-and-place images stored in an image library.
Figure 12:
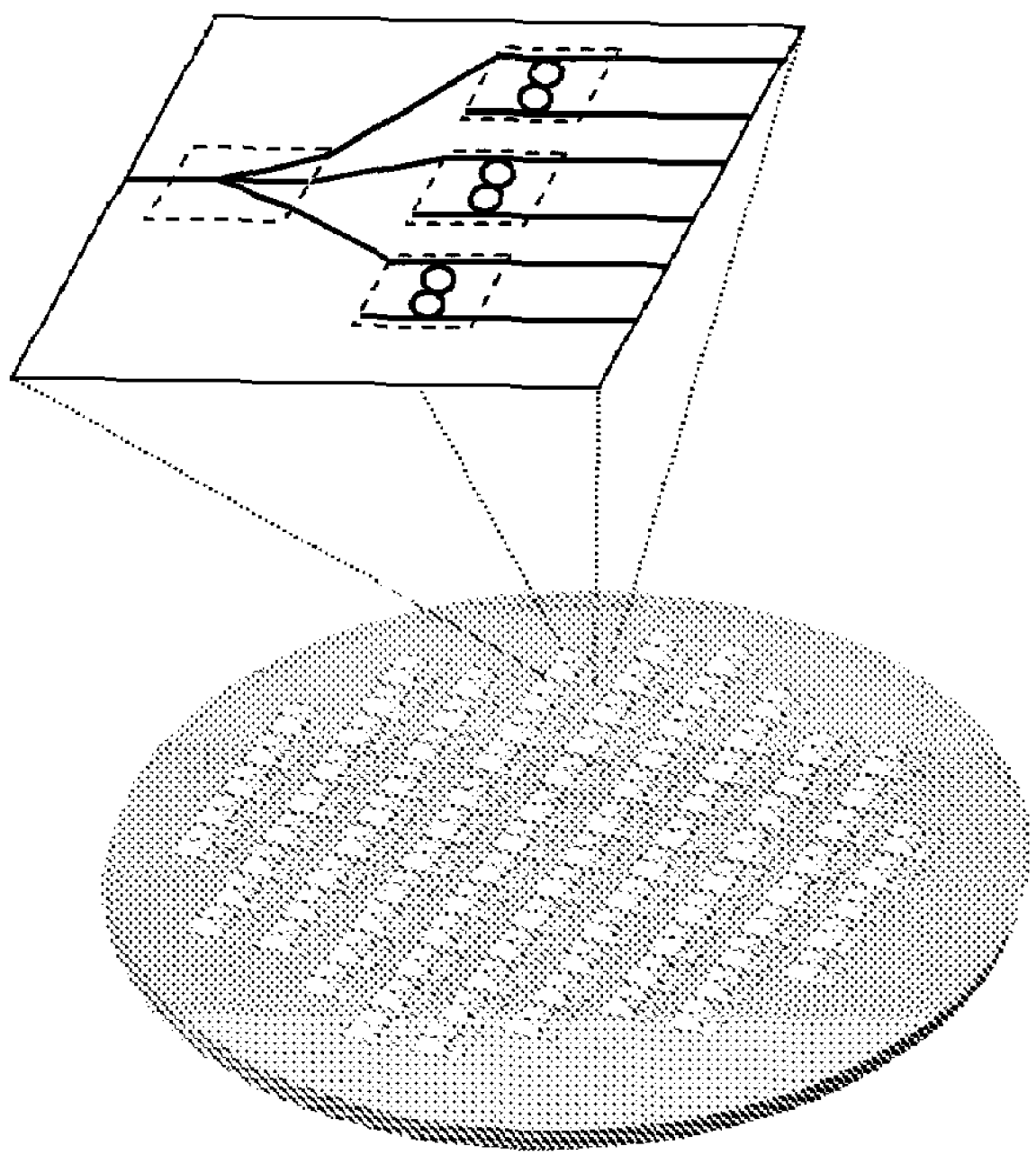
FIG. 12 shows a schematic of a wafer that has over seventy-five optical circuits.

Using a library of pre-existing elements or primitive subelements, a wide variety of unique optical circuits can be generated. If design rules are employed for the design of the elements, such as based upon common sizes, elements can be reused and shared across a wide variety of optical circuits. Considerable time and cost savings should be expected. FIG. 11 shows the system concept of arbitrary optical circuit generation using a reticle library of images. The optical circuit designer chooses elements from the reticle library, and decides how they are to be interconnected in order to satisfy desired circuit requirements. The size of the optical circuits is typically small, and many independent circuits can fit on a wafer. FIG. 12 shows a schematic of a wafer that has over seventy-five optical circuits. Each circuit might be unique.

The pick-and-place method is also useful for updating products with improved circuit elements or designs. For instance, if a new design with improved performance for one of the elements is discovered, it can replace the prior version of that element without needing to regenerate and re-optimize an entire optical circuit comprising a plurality of different elements. Product upgrades can be accomplished with little disruption.

In the foregoing description of the pick-and-place method for fabricating an optical circuit, photoresist was the preferred method of assimilating all the independent images into a final compound image. Photoresist is widely used in semiconductor manufacturing. It is possible to print images directly into an optical glass or polymer if the glass or polymer is photorefractive. Exposure to irradiance directly affects the refractive index creating waveguides and optical elements without the use of pattern transfer using photoresist. The pick-and-place method described herein applies to the printing of optical circuit in such glasses and polymers, and the procedure is essentially the same as described for this invention.

We claim:

1. An optical circuit, comprising:
    a substrate;
    a first optical circuit element formed on the substrate and having a perimeter, the first optical circuit element having a drop-in location within the perimeter of the first optical circuit element; and
    a second optical circuit element formed on the substrate at the drop-in location within the perimeter of the first optical circuit element.

2. The optical circuit of claim 1, wherein the drop-in location of the first optical circuit element optically interfaces with the second optical circuit element at a plurality of locations along a perimeter of the second optical circuit element.

3. The optical circuit of claim 1, wherein the first and second optical circuit elements are produced from one or more reticles.

4. The optical circuit of claim 1, wherein the first and second optical circuit elements are selected from an image library containing a plurality of optical circuit elements.

5. The optical circuit of claim 1, wherein the second optical circuit element is one of a group of optical circuit elements including a ring resonator, a Mach Zehnder interferometer, a wavelength filter, an optical switch, and an optical coupler, or a portion of one of the group of optical circuit elements.

6. The optical circuit of claim 1, wherein the first optical circuit element includes a plurality of optical waveguides.

7. The optical circuit of claim 6, wherein the first optical circuit element includes a plurality of optical waveguides, the plurality of optical waveguides optically coupled to the second optical circuit element.

8. The optical circuit of claim 3, wherein the one or more reticles comprise a first and second mask image, the first optical circuit element formed from the first mask image, the second optical circuit element formed from the second mask image.

9. The optical circuit of claim 8, wherein the second mask image is one of a plurality of second mask images, the second optical circuit element formed from one of the plurality of second mask images.

10. The optical circuit of claim 1, wherein the first optical circuit element comprises a plurality of drop-in locations and the second optical circuit element is one of a plurality of second optical circuit elements, such that one of the plurality of second optical circuit elements is formed at a corresponding one of the plurality of drop-in locations.

* * * * *